(12) United States Patent
Yamane et al.

(10) Patent No.: US 6,488,021 B1
(45) Date of Patent: Dec. 3, 2002

(54) METHOD AND APPARATUS FOR PRODUCING SEMICONDUCTOR ELEMENT

(75) Inventors: Keiji Yamane, Okayama (JP); Hideto Adachi, Osaka (JP); Akira Takamori, Osaka (JP)

(73) Assignee: Matsushita Electronics Corporation, Osaka (JP)

( * ) Notice: Subject to any disclaimer, the term of this patent is extended or adjusted under 35 U.S.C. 154(b) by 73 days.

(21) Appl. No.: 09/695,773

(22) Filed: Oct. 25, 2000

(30) Foreign Application Priority Data

Oct. 25, 1999 (JP) .............................. 11-303179

(51) Int. Cl.[7] ............................................. B28D 1/32
(52) U.S. Cl. ............................. 125/23.01; 125/23.02
(58) Field of Search ................... 125/23.01, 23.02, 125/24; 438/33, 42, 460, 462

(56) References Cited

U.S. PATENT DOCUMENTS

| 4,016,855 A | * | 4/1977 | Mimata ................... 125/13.01 |
| 4,236,296 A | * | 12/1980 | Woolhouse et al. .. 148/DIG. 28 |
| 4,237,601 A | * | 12/1980 | Woolhouse et al. ........... 438/33 |
| 5,180,685 A | * | 1/1993 | Yamamoto et al. .. 148/DIG. 72 |
| 5,272,114 A | * | 12/1993 | van Berkum et al. ........... 225/2 |
| 5,462,900 A | * | 10/1995 | Oki et al. ............. 148/DIG. 28 |
| 5,593,815 A | * | 1/1997 | Ahn ................................ 225/2 |
| 5,780,320 A | * | 7/1998 | Kinoshita ..................... 438/33 |

* cited by examiner

*Primary Examiner*—Joseph J. Hail, III
*Assistant Examiner*—David B. Thomas
(74) *Attorney, Agent, or Firm*—RatnerPrestia

(57) ABSTRACT

A method for producing a semiconductor element comprises the steps of: forming a plurality of grooves on a first surface of a semiconductor multi-layer structure along a first direction: forming a plurality of multi-element bars by cleaving the semiconductor multi-layer structure along a second direction; placing at least one of the plurality of multi-element bars on a support stage; and cleaving the at least one of the plurality of multi-element bars along the plurality of grooves by moving a pressure member in a longitudinal direction of the at least one of the plurality of multi-element bars while a constant load is applied by the pressure member to a second surface of the at least one of the plurality of multi-element bars, the second surface being opposite a third surface corresponding to the first surface of the at least one of the plurality of multi-element bars.

20 Claims, 6 Drawing Sheets

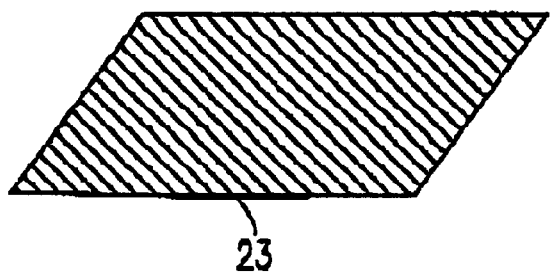
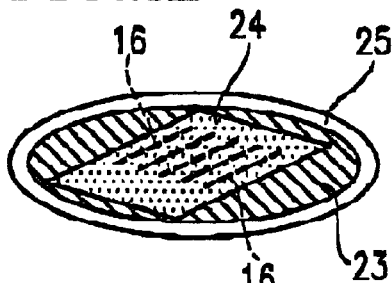
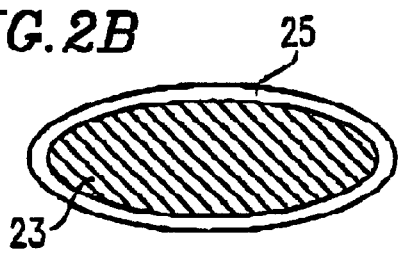
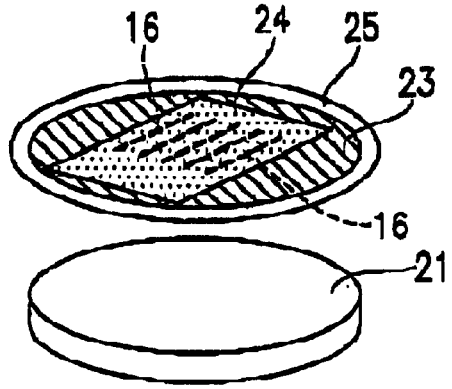
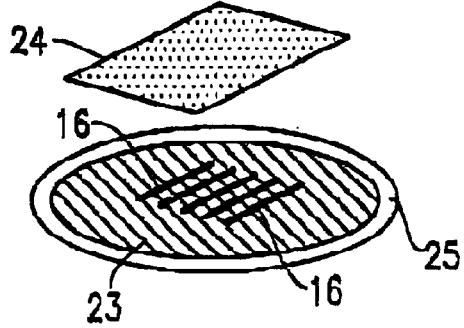
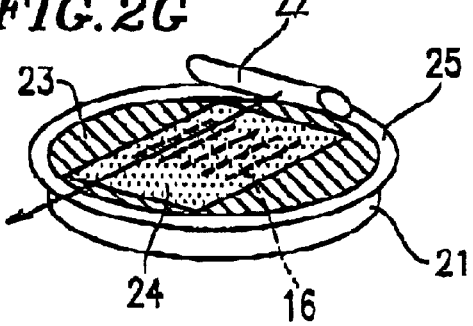

METHOD AND APPARATUS FOR PRODUCING SEMICONDUCTOR ELEMENT

BACKGROUND OF THE INVENTION

1. Field of the Invention

The present invention relates to a method for producing a semiconductor element and a cleavage apparatus for use in the method.

2. Description of the Related Art

A conventional method for producing a semiconductor element (e.g., a semiconductor laser element) will be described with reference to FIGS. 5A through 5C. Initially, a semiconductor multi-layer structure 11 is provided as a semiconductor wafer 1 by successively laminating a plurality of semiconductor layers including an active layer. A plurality of grooves 15 to be used for cleavage (hereinafter referred to as cleavage grooves) are provided on the front surface of the semiconductor multi-layer structure 11 along a longitudinal direction of the cavity of a semiconductor laser element (direction X in FIG. 5A). The grooves 15 are evenly spaced and parallel to each other. The active layer is provided about 4 μm below the front surface of the semiconductor multi-layer structure 11.

Thereafter, a stripe-patterned electrode 13 is provided on the entire front surface of the semiconductor multi-layer structure 11 excluding the cleavage grooves 15. A back electrode 12 is provided on the entire back surface of the semiconductor multi-layer structure 11. The wafer 1 is cut into rectangles. A plurality of short scratches are provided at an edge of the rectangular semiconductor multi-layer structure 11 along the longitudinal direction of the cavity of a semiconductor laser element (direction X). The scratches are evenly spaced as shown in FIG. 5A.

Thereafter, the integral of the semiconductor multi-layer structure 11, the patterned electrode 13, and the back electrode 12 is cleaved (first cleavage) in a direction perpendicular to the cleavage grooves 15 provided between the stripes of the patterned electrode 13, using the scratches 14 as starting points of cleavage. Thereby, a plurality of multi-element bars 16 are obtained. The multi-element bar 16 has the back electrode 12a on the entire back surface of he bar-shaped semiconductor multi-layer structure 11 and plurality of patterned electrodes 13 separated by the cleavage grooves 15 on the front surface of the bar-shaped semiconductor multi-layer structure 11 as shown in FIG. 5B.

Thereafter, referring to FIG. 5C, each multi-element bar 16 is cleaved (second cleavage) along the cleavage grooves 15, resulting in a plurality of semiconductor laser elements 17. Each semiconductor laser element 17 has the patterned electrode 13 on the front surface of the semiconductor multi-layer structure 11 and the back electrode 12a on the back surface of the semiconductor multi-layer structure 11. When a voltage is applied between the patterned electrode 13 and the back electrode 12a, laser light is emitted from a facet produced by the first cleavage.

The cleavage grooves 15 are, for example, scratches (grooves) formed mechanically by a diamond needle of a scriber or the like. In this case, there is a micro crack extending from the cleavage groove 15 inward the semiconductor multi-layer structure 11. The micro crack reduces the strength of crystal. Therefore, when a load is applied from the back electrode 12a side to the cleavage groove 15 provided on the multi-element bar 16, the multi-element bar 16 is easily cleaved along the micro crack having a lesser crystal strength. In order to conduct the second cleavage to the multi-element bar 16 on which the cleavage grooves 15 (scratches) are provided, a relatively small load is applied to the back electrode 12a in a longitudinal direction of the multi-element bar 16. For example, a load is applied to the back electrode 12a by a roller being rotated and moved on the back electrode 12a.

Japanese Laid-Open Publication No. 6-338662 discloses a method for forming scratches (grooves) as the cleavage grooves 15 on a semiconductor wafer in which semiconductor laser elements are provided. When the cleavage grooves 15 are formed mechanically used a scriber or the like, a plurality of cleavage grooves 15 need to be reliably provided from one edge to the other edge of the patterned electrode 13. Such a process reduces working efficiency.

Further, the semiconductor wafer 1 is easily broken along the scratches which is being formed on the semiconductor wafer 1. Breaks also easily occur along the scratches during the first cleavage in a direction perpendicular to the scratches. As a result, a yield of the semiconductor laser elements is lowered.

To address the above-described problems, the cleavage grooves 15 may be provided by etching. In this case, the front surface of the semiconductor wafer is first coated with a resist film, excluding portions thereof in which the cleavage grooves 15 will be provided. Such portions which has not been covered with the resist film are etched, resulting in the cleavage grooves 15 having a V-shaped cross-section as shown in FIG. 7. In such a process, all the cleavage grooves 15 are formed at once. Therefore, the working efficiency of production of the cleavage grooves 15 is improved as compared with when the cleavage grooves 15 are formed mechanically using a scriber or the like as described above.

Japanese Laid-Open Publication No. 62-137894 discloses a cleavage apparatus 2 shown in FIG. 6. In the cleavage apparatus 2, etched grooves are provided as the cleavage grooves 15 on the multi-element bar 16. The multi-element bar 16 is placed on a film 31, and a sheet 34 is provided on the multi-element bar 16. Further, the sheet 34 is covered with a film 32. Thereafter, a load is applied via the film 31 to the multi-element bar 16 using a roller 33 so that the multi-element bar 16 is cleaved.

As described above, when the cleavage grooves 15 (etched grooves) are formed by etching, substantially no micro crack is generated inside the semiconductor multi-layer structure 11 unlike the scratches mechanically provided using a diamond needle or the like. Therefore, portions having low strength are not clearly provided inside the semiconductor multi-layer structure 11. Therefore, when the multi-element bar 16 is subjected to the second cleavage, a greater load is required as compared with when the multi-element bar 16 has the cleavage grooves 15 mechanically formed. In this case, the multi-element bar 16 cannot be reliably cleaved (second cleavage) when a load applied by the roller 33 is relatively low.

In particular, in the apparatus 2, the multi-element bar 16 is sandwiched by a pair of the films 31 and 32, and is further held by a ring, thereby providing tension for the film 31. A load is applied to the multi-element bar 16 using the roller 33. Therefore, when the tension of the film 31 is changed, the load applied to the multi-element bar 16 is likely to be changed. Moreover, the film 31 or the multi-element bar 16 may be displaced due to the pressure caused by the roller 33. The above-described reasons makes it difficult to apply a constant load to the multi-element bar 16. It is also difficult to rotate the roller 33 smoothly while applying a constant load to the multi-element bar 16 sandwiched by a pair of the films 31 and 32.

As described above, it is difficult to cleave the multi-element bar 16 sandwiched by a pair of the films 31 and 32 by applying a constant load to the multi-element bar 16.

Japanese Laid-Open Publication No. 54-93356 discloses a cleavage method in which the cleavage grooves 15 having a V-shaped cross-section is formed by etching, and the insides of the cleavage grooves 15 are subjected to rough surface treatment, thereby providing micro cracks inside the semiconductor multi-layer structure 11; and thereafter, by rotating a roller, a load is applied to a surface (back surface) of the multi-element bar 16 opposite the surface on which the cleavage groove 15 are provided so that the multi-element bar 16 is cleaved (second cleavage). In such a method, the strength of the cleavage grooves 15 can be clearly distinguished from the strength of portions in which the cleavage grooves 15 are not provided. Therefore, a small load applied to the back surface causes the second cleavage in the multi-element bar 16.

However, in this case, the rough surface treatment is required after the cleavage grooves 15 have been provided by etching, thereby reducing working efficiency. Moreover, when the cleavage grooves 15 are subjected to the rough surface treatment, micro cracks are accidentally generated in portions other than the insides of the cleavage grooves 15. The semiconductor multi-layer structure 11 may be broken at such portions.

Further, when the multi-element bar 15 is subjected to the first cleavage, the semiconductor multi-layer structure 11 is likely to be broken along the cleavage grooves 15 which are deep.

SUMMARY OF THE INVENTION

According to one aspect of the present invention, a method for producing a semiconductor element comprises the steps of: forming a plurality of grooves on a first surface of a semiconductor multi-layer structure along a first direction; forming a plurality of multi-element bars by cleaving the semiconductor multi-layer structure along a second direction; placing at least one of the plurality of multi-element bars on a support stage; and cleaving the at least one of the plurality of multi-element bars along the plurality of grooves by moving a pressure member in a longitudinal direction of the at least one of the plurality of multi-element bars while a constant load is applied by the pressure member to a second surface of the at least one of the plurality of multi-element bars, the second surface being opposite a third surface corresponding to the first surface of the at least one of the plurality of multi-element bars.

In one embodiment of this invention, the semiconductor multi-layer structure includes an active layer.

In one embodiment of this invention, the first direction is orthogonal to the second direction.

In one embodiment of this invention, the plurality of grooves are formed by etching.

In one embodiment of this invention, the multi-element bar is placed on the support stage via a support sheet.

In one embodiment of this invention, the support sheet includes polyvinyl chloride.

In one embodiment of this invention, the constant load is applied by the pressure member to the at least one of the plurality of multi-element bars via a protection sheet.

In one embodiment of this invention, the protection sheet includes a polyethylene terephthalate sheet, a surface of which is to be in contact with the pressure member is coated with a silicone resin.

In one embodiment of this invention, the support stage includes a rigid material.

In one embodiment of this invention, the rigid material includes at least one of a quartz, a glass, a metal, a stone, and a rigid plastic.

In one embodiment of this invention, a depth of the plurality of grooves is about 0.5 $\mu$m or more and about 5 $\mu$m or less from the first surface.

In one embodiment of this invention, a moving speed of the pressure member is about 10 mm/sec or more and about 100 mm/sec or less.

In one embodiment of this invention, the constant load applied to the at least one of the plurality of multi-element bars is about 5 N or more and about 20 N or less per multi-element bar.

According to another aspect of the present invention, a cleavage apparatus is provided for producing a semiconductor element using at least one multi-element bar, a plurality of grooves being provided in a predetermined direction on a first surface of the at least one multi-element bar. The apparatus comprises: a support stage for the at least one multi-element bar being provided; and a pressure member for applying a constant load to a second surface of the at least one multi-element bar, the second surface being opposite the first surface of the at least one multi-element bar, while the pressure member is moved in a longitudinal direction of the at least one multi-element bar.

In one embodiment of this invention, the at least one multi-element bar includes an active layer.

In one embodiment of this invention, the plurality of grooves are formed by etching.

In one embodiment of this invention, the support stage includes a rigid material.

In one embodiment of this invention, the rigid material includes at least one of the quartz, a glass, a metal, a stone, and a rigid plastic.

In one embodiment of this invention, a moving speed of the pressure member is about 10 mm/sec or more and about 100 mm/sec or less.

In one embodiment of this invention, the constant load applies to the at least one multi-element bars is about 5 N or more and about 20 N or less per multi-element bar.

In one embodiment of this invention, the pressure member does not rotate on the at least one multi-element bar.

In one embodiment of this invention, the pressure member is held by a spring, and the constant load is applied by the spring to the at least one multi-element bar.

Thus, the invention described herein makes possible the advantages of providing a method for producing a semiconductor element and a cleavage apparatus, in which a multi-element bar having shallow cleavage grooves formed by etching is efficiently and reliably cleaved into a plurality of semiconductor elements.

These and other advantages of the present invention will become apparent to those skilled in the art upon reading and understanding the following detailed description with reference to the accompanying figures.

BRIEF DESCRIPTION OF THE DRAWINGS

FIGS. 2A through 2G are diagrams schematically showing a process for producing a semiconductor element according to the present invention.

DESCRIPTION OF THE PREFERRED EMBODIMENTS

Figure 5A:
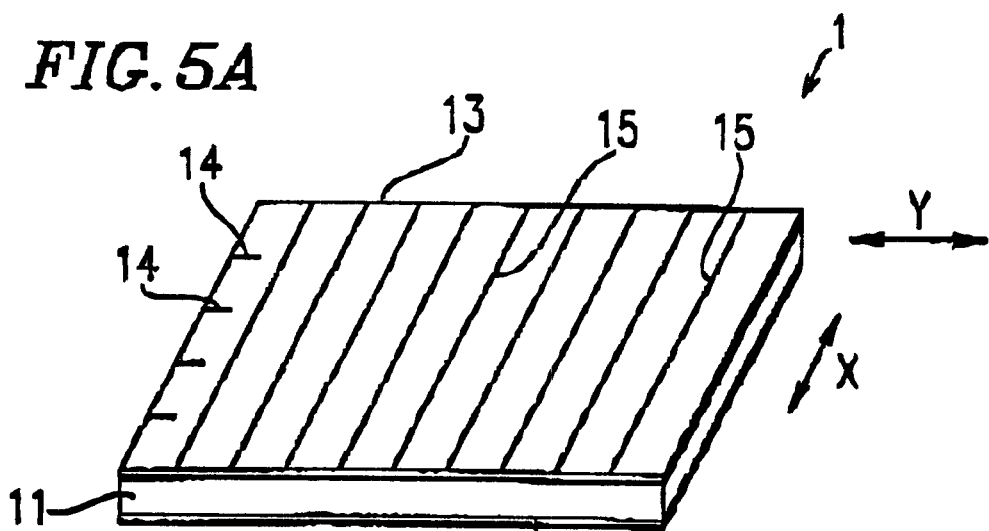
FIGS. 5A through 5C are perspective views showing a process for a semiconductor element.
Figure 5B:
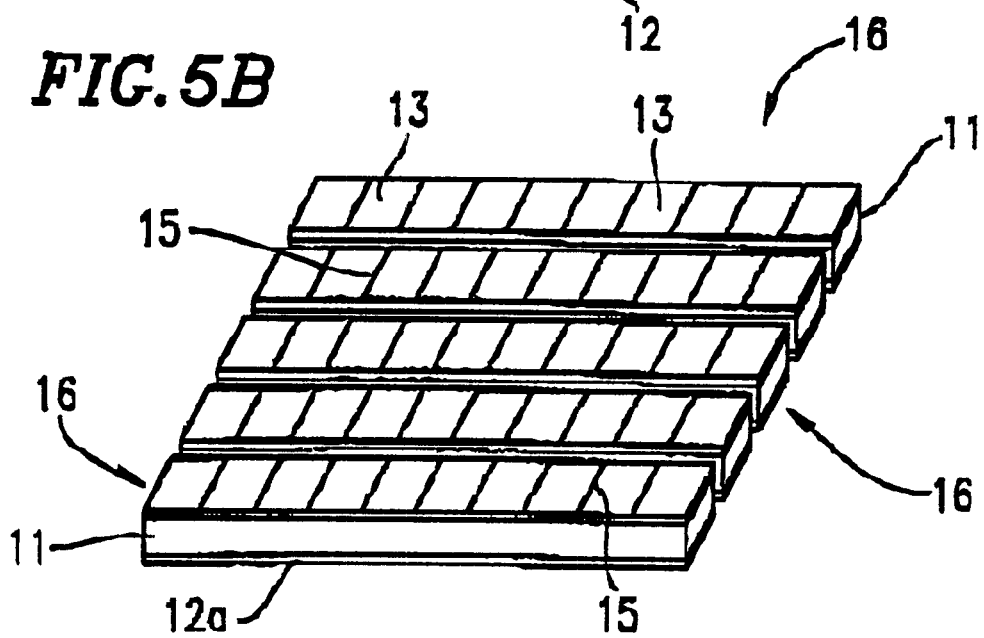
Figure 5C:
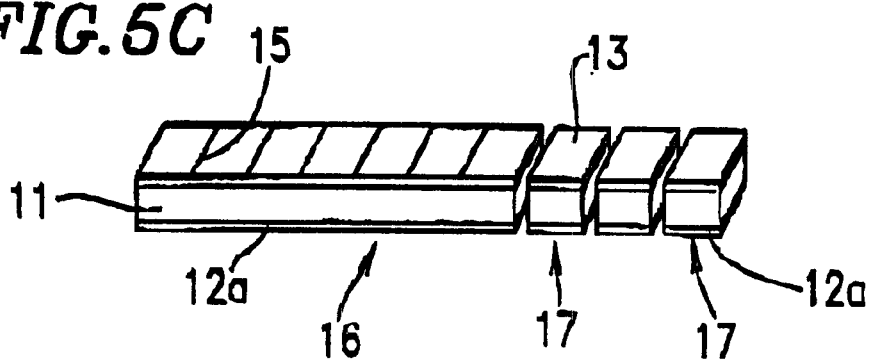
Figure 6:
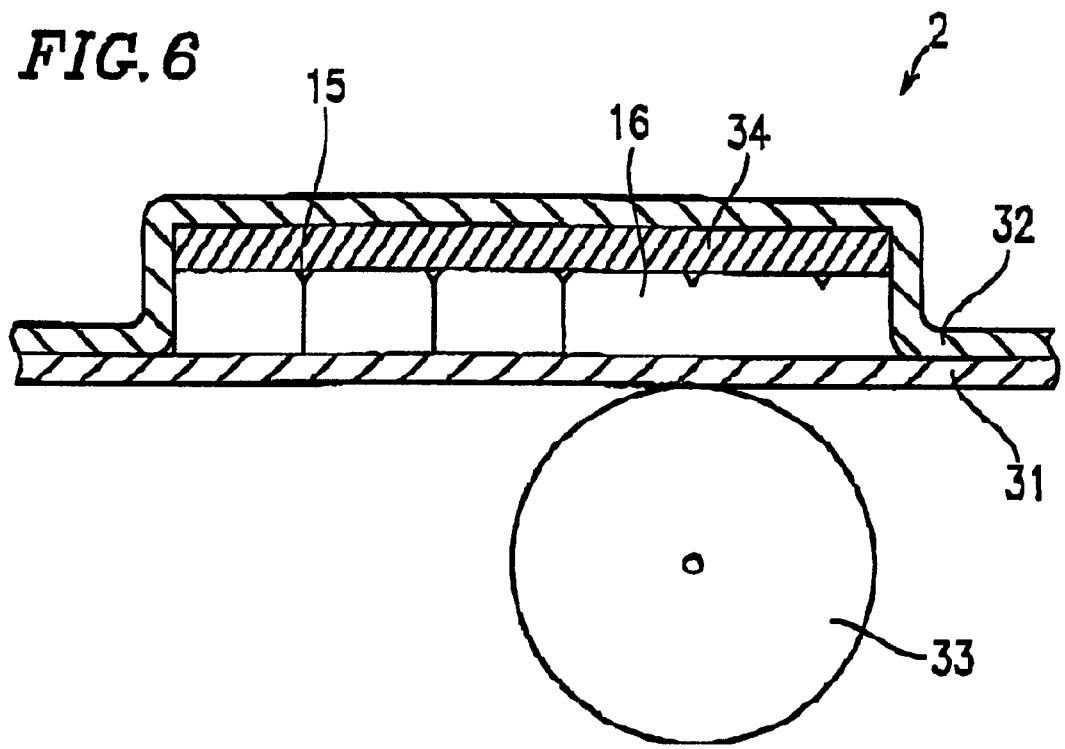
FIG. 6 is a diagram schematically showing a configuration of an exemplary apparatus for producing a semiconductor laser element.
Figure 7:
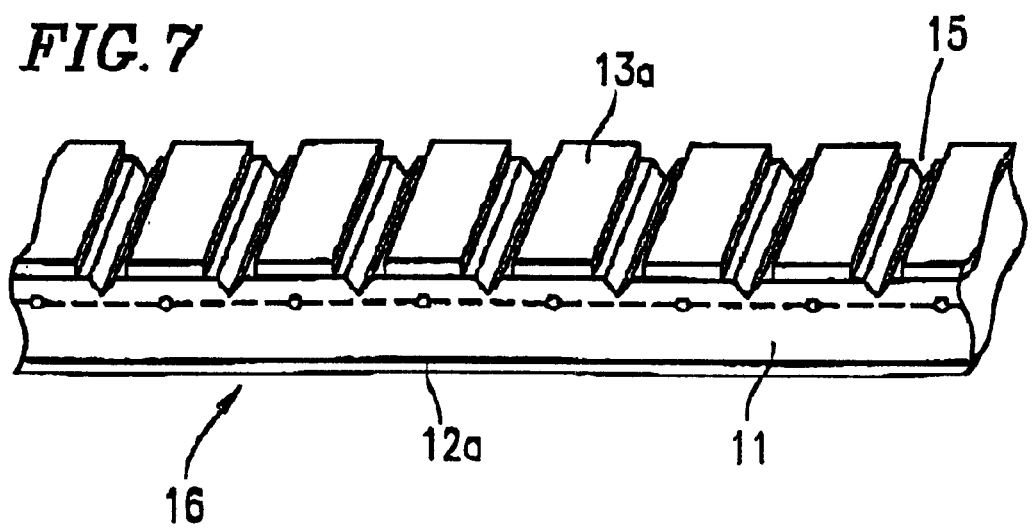
FIG. 7 is a perspective view showing a major portion of the multi-element bar in which cleavage grooves are formed by etching.

Hereinafter, the present invention will be described by way of illustrative examples with reference to the accompanying drawings. In the examples, a method for producing a semiconductor laser element and a cleavage apparatus will be described. In the method of the present invention for producing a semiconductor laser element, multi-element bars 16 are produced in a way similar to that of the conventional method for producing a semiconductor laser element as shown in FIGS. 5A through 5C. The method of the present invention differs from the conventional method shown in FIGS. 5A through 5C in that cleavage grooves 15 are not scratches mechanically formed, but are etched grooves formed by etching. The multi-element bars 16 are subjected to the second cleavage using a cleavage apparatus 100 shown in FIG. 1. The direction along which the first cleavage is conducted is not necessarily orthogonal to the direction along which the second cleavage is conducted. The angle the two direction attain is designated to various values depending on the examples.

The multi-element bars 16 are, for example, about 30 mm long. The multi-element bars 16 are cleaved (second cleavage) into a plurality of semiconductor laser elements 17 having a cavity length of about 200 $\mu$m and a width of about 160 $\mu$m. The thickness of a semiconductor multi-layer structure 11 is about 100 $\mu$m. An active layer is positioned about 4 $\mu$m below the front surface of the semiconductor multi-layer structure 11. The depth of the cleavage groove 15 provided at the stripes of the patterned electrode 13a is about 0.5 through 5 $\mu$m. The cleavage groove 15 are etched grooves formed by etching the front surface of the semiconductor multi-layer structure 11. If the depth of the cleavage grooves 15 is more than about 5 $\mu$m, breaks occur from the cleavage grooves 15 which are the starting points of the first cleavage. If the depth of the cleavage grooves 15 is less than about 0.5 $\mu$m, a second cleavage described below cannot be achieved.

Figure 1:
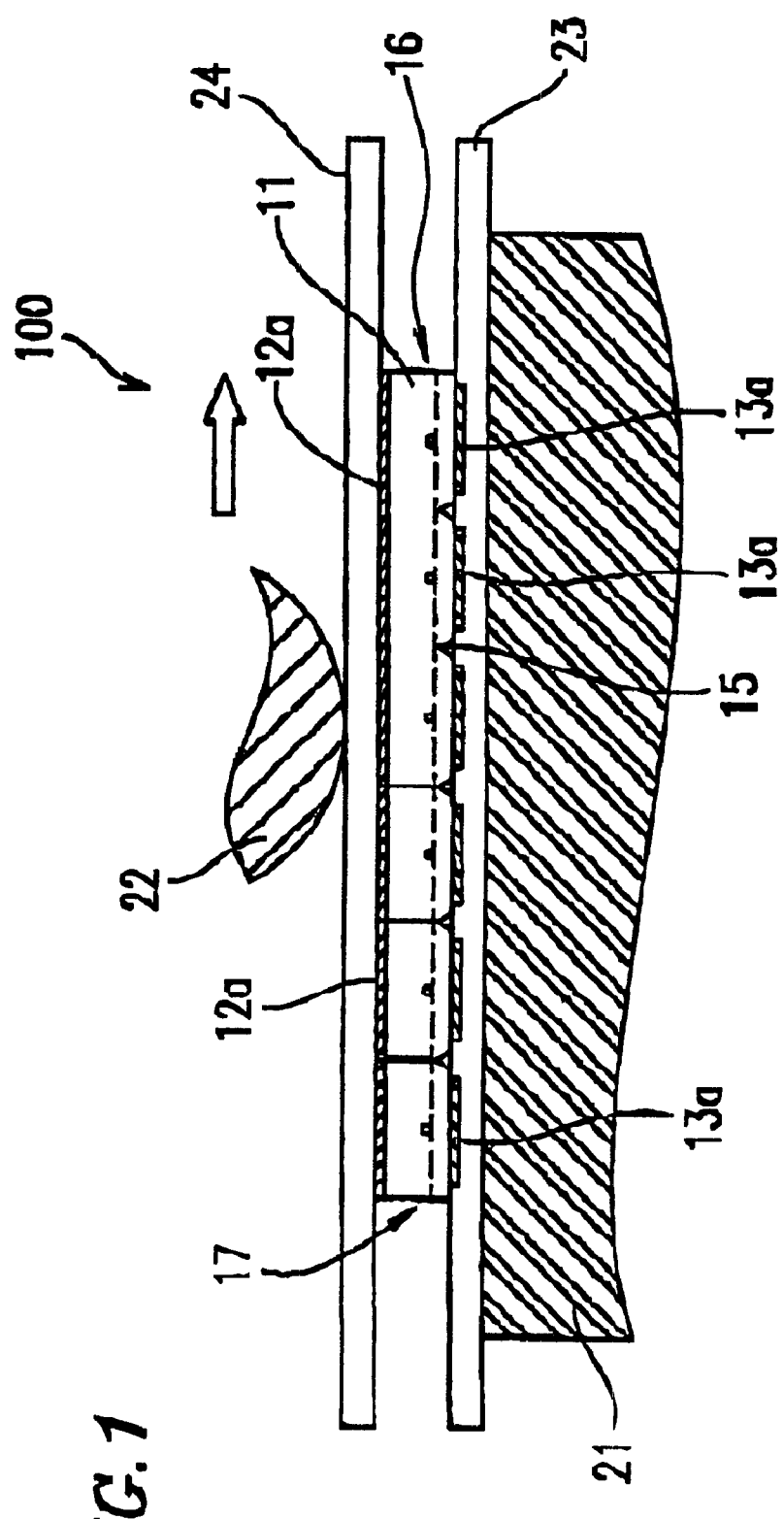
FIG. 1 is a cross-sectional view showing a major portion of an exemplary apparatus for producing a semiconductor device according to the present invention.

The cleavage apparatus 100 shown in FIG. 1 includes a disc-shaped support stage on which the multi-element bars 16 are placed and a pressing member 22 which is moved over the support stage 21 in parallel to at surface of the support stage 21.

For example, the support stage 21 includes a rigid quartz plate. The front surface of the support stage 21 is mirror polished and horizontally held. The support stage 21 is not limited to a disc shape.

The pressure member 22 includes a stainless rod having a diameter of about 5 mm, for example. The pressure member 22 is provided over and parallel to the front surface of the support stage 21 while being biased downward by a spring or its own weight. The pressure member 22 is slid in a longitudinal direction of the multi-element bars 16 (along an edge formed by the first cleavage) over the full length of the multi-element bars 16.

Using such an apparatus, the multi-element bars 16 are subjected to second cleavage. Referring to FIG. 2A, for example, a support sheet 23 of polyvinyl chloride having a thickness of about 70 $\mu$m and a ring film frame 25 are prepared. Referring to FIG. 2B, the support sheet 23 is attached to the ring film frame 25. Referring to FIG. 2C, the multi-element bars 16 are placed on the support sheet 23, and are evenly spaced in parallel. The multi-element bars 16 are placed on the front surface of the support sheet 23 in such a manner that a surface of the patterned electrode 13 contacts the front surface of the support sheet 23.

Thereafter, referring to FIG. 2D, a protection sheet 24 is provided in such a manner as to cover the entire multi-element bars 16 provided on the support sheet 23, resulting in a state shown in FIG. 2E. The protection sheet 24 is a relatively rigid polyethylene terephthalate (PET) sheet having a thickness of about 50 $\mu$m whose surface is coated with a silicone resin. The protection sheet 24 is provided over the multi-element bars 16 so that the surface of the protection sheet 24 which is coated with the silicone resin is positioned at the pressure member 22 side. Since, the protection sheet 24 is made of the relatively rigid material, the protection sheet 24 is substantially unbendable. Thereby, the multi-element bars 16 are held substantially horizontal.

Referring to FIG. 2F, the ring film frame 25 thus constructed is placed on the support stage 21, preferably in such a manner that the cleavage grooves 15 are orthogonal to a direction along which the pressure member 22 is moved over the support stage 21. The cleavage grooves 15 provided on the multi-element bars 16 are used for second cleavage.

The pressure member 22 is brought to an edge of each multi-element bar 16. The pressure member 22 applies an appropriate predetermined load via the protection sheet 24 to the edge of the multi-element bar 16. When the pressure member 22 is held with a spring, the load is generated by the spring. Referring to FIG. 2G, the pressure member 22 is horizontally translated in a longitudinal direction (along an edge formed by the first cleavage) of each multi-element bar 16 while being pressed on the multi-element bar 16. The pressure member 22 contacts the multi-element bars 16 at at line substantially parallel to the cleavage groove 15. The pressure member 22 is moved at a constant speed over the full length of the multi-element bars 16 in the longitudinal direction while applying a constant load to the multi-element bars 16. The moving speed is, for example, about 10 mm/sec.

Figure 3A:
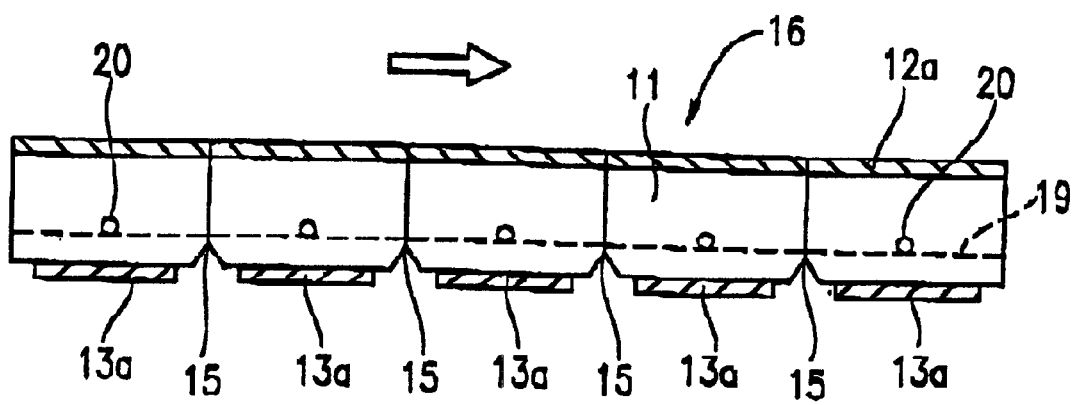
FIG. 3A is a side view showing a multi-element bar in a process for producing a semiconductor element according to the present invention.
Figure 3B:
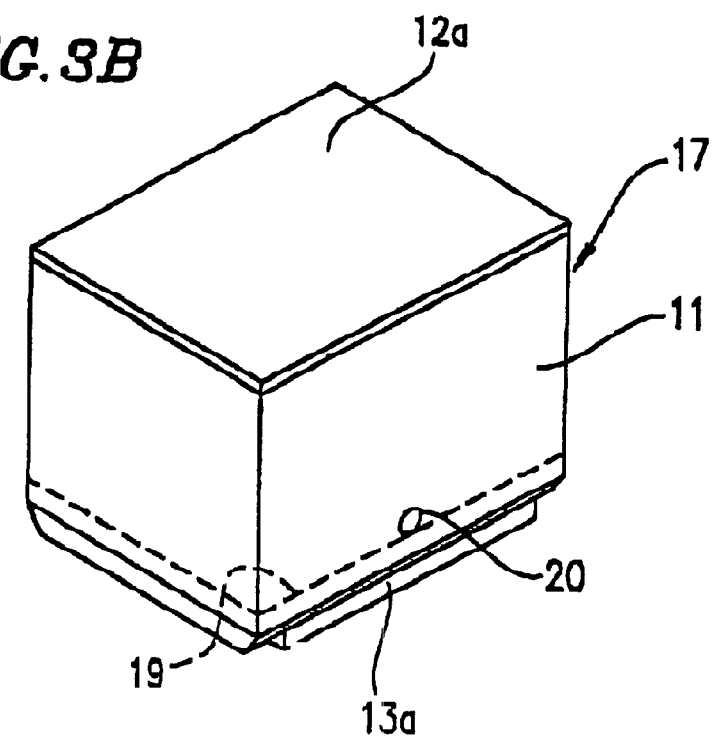
FIG. 3B is a perspective view showing a semiconductor element obtained by cleaving the multi-element bar shown in FIG. 3A.

Referring to FIG. 3A, when the pressure member 22 passes above the cleavage grooves 15 provided on each multi-element bar 16, the multi-element bar 16 is cleaved at the cleavage grooves 15. The cleavage starts from the cleavage groove 15 and proceeds toward the back electrode 12a over the full thickness of the multi-element bars 16, resulting in a flat facet. The cleavage is conducted successively at all the cleavage grooves 15. The second cleavage of the multi-element bars 16 is completed. The resultant semiconductor laser element 17 having a predetermined size is shown in FIG. 3B. In FIGS. 3A and 3B, reference numeral 19 indicates an active layer, and reference numeral 20 indicates a portion emitting laser light. Note that the surfaces of the multi-element bars 16 in which the cleavage grooves 15 are formed do not necessarily need to face the support stage 21. The multi-element bars 16 may be placed on the support stage 21 in such a manner that the surfaces of the multi-element bars 16 on which the back electrode 12a are provided faces the support stage 21.

The multi-element bars 16 placed on the support sheet 23 are covered with the protection sheet 24. Therefore, the semiconductor laser elements 17 are prevented from flying off the support sheet 23 when the multi-element bars 16 are cleaved by the pressure member 22.

The provision of the protection sheet 24 removes the necessity of application of an adhesive on the support sheet 23. In this case, a surface of the laser element 17 on which the patterned electrode 13 is provided, facets obtained by the first cleavage, and facets obtained by the second cleavage are free from an adhesive which may obstruct a subsequent die bonding process or may impair laser oscillation. Further, it is possible to avoid a problem that the laser elements 17 are not separated when the support sheet 23 is expanded, since the facets obtained by the second cleavage are attached to each other via an adhesive.

The protection sheet 24 is removed. The support sheet 23 is expanded so that the gap between each semiconductor laser element 17 is increased. Thereby, a subsequent process is facilitated. Specifically, each semiconductor laser element 17 can be easily picked up. Thus, a plurality of semiconductor laser elements 17 which have predetermined size and whose facets obtained by the second cleavage are entirely flat are obtained.

In the cleavage apparatus of the above-described example, control of the load applied by the pressure member 22 is a key factor in second cleavage in which the multi-element bar 16 is reliably cleaved into the semiconductor laser elements 17 and flat facets are obtained. As described in the DESCRIPTION OF THE RELATED ART section, the crystal strength of the shallow cleavage grooves 15 formed by etching cannot be clearly distinguished from the crystal strength of portions in which the cleavage grooves 15 are not provided. The cleavage grooves 15 require a greater load for cleavage as compared with scratches mechanically formed by a scriber or the like. Moreover, the pressure member 22 needs to be continuously and reliably moved on the entire back surface of the multi-element bar 16.

When the pressure member 22 is continuously moved in a longitudinal direction of the multi-element bar 16, an applied load is designated to be greater than the crystal strength of the cleavage grooves 15 and less than the crystal strength of portions in which the cleavage grooves 15 are not provided. If the applied load is less than the crystal strength of the cleavage grooves 15, the multi-element bar 16 is not cleaved even when the pressure member 22 reaches directly above the cleavage grooves 15. In this case, substantially no semiconductor laser elements 17 are obtained. If the applied load is greater than the crystal strength of the portions in which the cleavage grooves 15 are not provided, the semiconductor laser elements 17 are smaller than the desired size or damaged, thereby significantly reducing yield upon the second cleavage. The applied load is determined depending on the material and thickness of the support sheet 23 and the protection sheet 24, the crystal strength and crystal direction and cavity length, width, thickness, and the like of the semiconductor laser elements to be obtained by the second cleavage. An experiment which the inventors have conducted demonstrated that when the applied load was about 5 N or more and about 20 N or less for each multi-element bar 16, the multi-element bars 16 were stably cleaved (second cleavage) into the semiconductor laser elements 17.

Figure 4A:
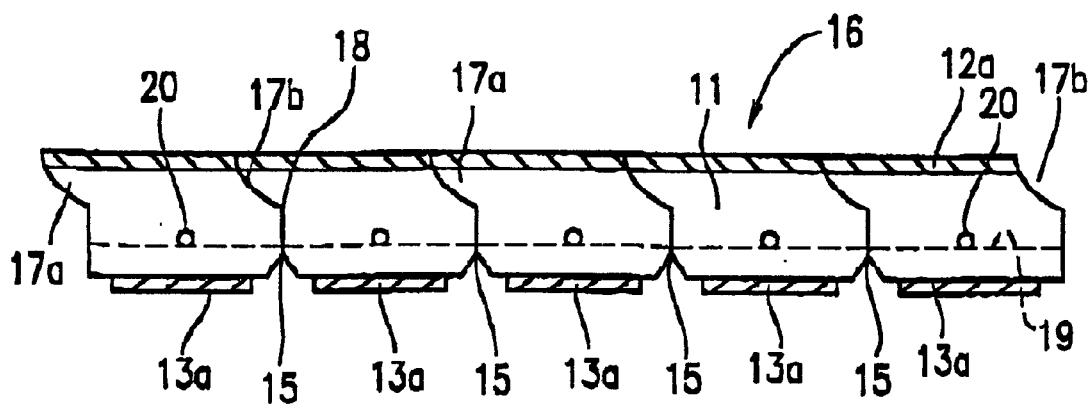
FIG. 4A is a side view showing a multi-element bar after improper cleavage.
Figure 4B:
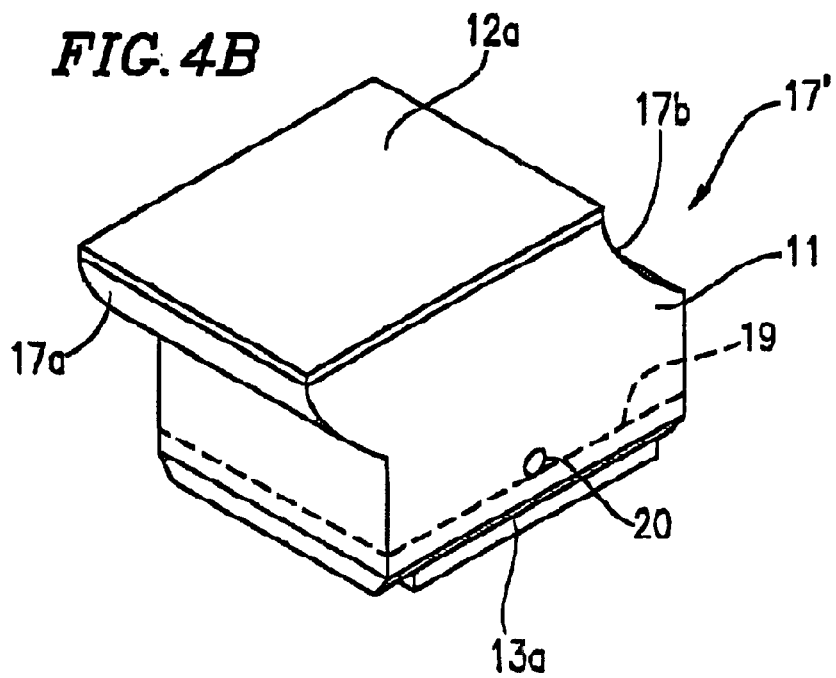
FIG. 4B is a perspective view showing a semiconductor element obtained by the improper cleavage shown in FIG. 4A.

The translation speed of the pressure member 22 is preferably about 10 mm/sec or more. If the speed is more than about 100 mm/sec, the applied load which contributes to the cleavage of the cleavage groove 15 is reduced. In this case, a greater applied load is required. In addition, the quick movement of the pressure member 22 causes the following problem. When the pressure member 22 is translated to be brought in the vicinity of above the cleavage groove 15, cleavage is started. However, the pressure member 22 is quickly moved away from the cleavage groove 15. The cleavage may be stopped halfway. The multi-element bar 16 is dragged in the direction of the translation of the pressure member 22, so that the remaining cleavage is forcedly completed. In this case, referring to FIGS. 4A and 4B, facets obtained by the cleavage are curved in the vicinity of the back surface of the multi-element bar 16 (convex facet portion 17a and concave facet portion 17b). Such facets depart from the desired facets which are flat. When the resultant semiconductor laser element 17' is incorporated into an optical apparatus and is mounted on an appropriate substrate of the optical apparatus by die bonding, the position of the front surface of the semiconductor laser element 17' is not aligned with the position of the back surface of the semiconductor laser element 17'. A position of laser emission is likely to be shifted from the desired position. Moreover, the convex facet portion 17a is broken off the semiconductor laser element 17' during assembly of an optical apparatus. Such a broken piece is likely to be attached to a laser oscillation facet, thereby preventing emission of laser light.

The support stage 21 needs to be sufficiently rigid so a to keep the position of the multi-element bar 16 from being lowered by depression of the support stage 21 caused by a load applied by the translating pressure member 22. The material of the support stage 21 is not limited to the quartz plate, but may be a glass plate, a metal plate, a stone plate, a rigid plastic plate, or the like. Further, the surface of the support stage 21 on which the multi-element bars 16 are placed is preferably flat like a mirror so that a load is evenly applied by the translating pressure member 22 to the entire multi-element bar 16.

The support sheet 23 is provided so that the semiconductor laser elements 17 are prevented from being scattered when the multi-element bars 16 are cleaved (second cleavage). The support sheet 23 has preferably a small level of elasticity so that the load applied by the pressure member 22 is not dispersed and the multi-element bars 16 are not significantly sunk, whereby the multi-element bars 16 are reliably supported by the support stage 21. For example, the thickness of the support sheet 23 is about 70 $\mu$m which is relatively thin.

When a load is applied by the pressure member 22 to the multi-element bars 16, the multi-element bars 16 are sunk a certain amount into the support sheet 23. The multi-element bars 16 are stabilized by the rigid support stage 21 and is no longer sunk. Since the applied load is absorbed by the support sheet 23, the multi-element bars 16 is not damaged. Further, the semiconductor laser elements 17 after the second cleavage are prevented from being scattered or shifted, since the semiconductor laser elements 17 are fixed to the support sheet 23.

The protection sheet 24 provided on the multi-element bars 16 are preferably coated with silicone resin at least one the surface thereof which is pressed by the pressure member 22. In this case, the coefficient of kinetic friction between the pressure member 22 and the protection sheet 24 is significantly small, even when the pressure member 22 is not a roller having rotation mechanism. Therefore, one of the pressure member 22 and the protection sheet 24 can be translated while a great load is stably applied to the multi-element bars 16. Conversely, when the pressure member 22 is a roller which rotates on its own axis, the protection sheet 24 may get entangled with the rotating roller when a great load is applied. Alternatively, the roller is rotated but may be moved nowhere. In this case, a constant load is unlikely to be reliably applied. Further, vibration occurs in the translating roller depending on the condition of an engagement mechanism of a rotating portion and a supporting portion of the roller. Such vibration is likely to cause variations in the applied load. The roller needs to be well maintained in order to achieve a constant load and a constant speed. The use of roller is not suited for mass production.

The pressure member 22 is not limited to a specific material, shape, and the like as long as the pressure member 22 can apply a constant and great load and can move at a constant speed over the multi-element bar 16. Further, the direction along which the pressure member 22 is moved is not limited to a longitudinal direction of the multi-element bar 16, but may be any direction as long as the pressure member 22 can apply a constant load to the multi-element bar 16.

The coefficient of kinetic friction between the pressure member 22 and the protection sheet 24 varies depending on the materials thereof (see, e.g., "Mechanical Property of Plastics", FIGS. 16.15 at page 223, published by Nikkan Kogyo Shinbunsha). Preferably, the coefficient of kinetic friction between the pressure member 22 and the protection sheet 24 is about 0.1 or less.

The protection sheet 24 is made of a polyethylene terephthalate (PET) sheet which is a relatively rigid resin sheet. Therefore, a load is reliably applied to the multi-element bar 16 by the pressure member 22.

Due to the interposition of the protection sheet 24, the multi-element bars 16 and the pressure member 22 do not contact with each other. Therefore, even when a great load is applied, the semiconductor laser elements 17 are prevented from being scattered and being damaged.

The protection sheet 24 provided on the multi-element bars 16 is preferably extended from widthwise edges of the multi-bars 16, keeping the horizontal state rather than bending along the edges. In this case, since a step of the protection sheet 24 at the widthwise edge of the multi-element bar 16 positioned upstream of the translation is reduced. Therefore, when the pressure member 22 is moved from the upstream edge of the multi-element bar 16, the semiconductor laser element 17 positioned at the upstream edge is substantially not damaged.

In the second cleavage method and apparatus of the above-described examples, the second cleavage is conducted at the cleavage grooves 15 which are shallow grooves formed by etching. It is apparently understood that the second cleavage method and apparatus of the above-described examples are also preferable for the cleavage using the scratches mechanically formed by a scriber or the like described in the DESCRIPTION OF THE RELATED ART section or for separation of the multi-element bar 16 half broken by dicing. The method for producing a semiconductor element and the cleavage apparatus of the present invention may be applied to any semiconductor element such as a memory device, light-emitting device, light-receiving device, and a semiconductor integrated circuit, as well as a semiconductor laser element.

As described above, in the method for producing a semiconductor and the cleavage apparatus of the present invention, a multi-element bar having cleavage grooves formed by etching can be cleaved efficiently and reliably into a plurality of semiconductor elements. Moreover, the cleavage can be achieved by sliding a pressure member having no roller mechanism over the multi-element bar. The mechanism of the cleavage apparatus can be significantly simplified.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a semiconductor element comprising the steps of:

forming a plurality of grooves on a first surface of a semiconductor multi-layer structure along a first direction and having a depth of about 0.5 $\mu$m or more and about 5 $\mu$m or less from the first surface;

forming a plurality of multi-element bars by cleaving the semiconductor multi-layer structure along a second direction;

placing at least one of the plurality of multi-element bars on a support stage; and cleaving the at least one of the plurality of multi-element bars along the plurality of grooves by moving a pressure member in a longitudinal direction of the at least one of the plurality of multi-element bars while a constant load is applied by the pressure member to a second surface of the at least one of the plurality of multi-element bars, the second surface being opposite a third surface corresponding to the first surface of the at least one of the plurality of multi-element bars.

2. A method according to claim 1, wherein the semiconductor multi-layer structure includes an active layer.

3. A method according to claim 1, wherein the first direction is orthogonal to the second direction.

4. A method according to claim 1, wherein the plurality of grooves are formed by etching.

5. A method according to claim 1, wherein the multi-element bar is placed on the support stage via a support sheet.

6. A cleavage apparatus for producing a semiconductor element using at least one multi-element bar, a plurality of grooves being provided in a predetermined direction on a first surface of the at least one multi-element bar, the apparatus comprising:

a support stage for the at least one multi-element bar being provided and including a rigid material; and a pressure member for applying a constant load to a second surface of the at least one multi-element bar, the second surface being opposite the first surface of the at least one multi-element bar, while the pressure member is moved in a longitudinal direction of the at least one multi-element bar.

7. An apparatus according to claim 6, wherein the at least one multi-element bar includes an active layer.

8. An apparatus according to claim 6, wherein the plurality of grooves are formed by etching.

9. An apparatus according to claim 6, wherein the rigid material includes at least one of a quartz, a glass, a metal, a stone, and a rigid plastic.

10. A method for producing a semiconductor element comprising the steps of:

forming a plurality of grooves on a first surface of a semiconductor multi-layer structure along a first direction;

forming a plurality of multi-element bars by cleaving the semiconductor multi-layer structure along a second direction;

placing at least one of the plurality of multi-element bars on a support stage via a support sheet that includes polyvinyl chloride; and cleaving the at least one of the plurality of multi-element bars along the plurality of grooves by moving a pressure member in a longitudinal direction of the at least one of the plurality of multi-element bars while a constant load is applied by the pressure member to a second surface of the at least one of the plurality of multi-element bars, the second surface being opposite a third surface corresponding to the first surface of the at least one of the plurality of multi-element bars.

11. A method for producing a semiconductor element comprising the steps of:

forming a plurality of grooves on a first surface of a semiconductor multi-layer structure along a first direction;

forming a plurality of multi-element bars by cleaving the semiconductor multi-layer structure along a second direction;

placing at least one of the plurality of multi-element bars on a support stage that includes a rigid material; and cleaving the at least one of the plurality of multi-element bars along the plurality of grooves by moving a pressure member in a longitudinal direction of the at least one of the plurality of multi-element bars while a constant load is applied by the pressure member to a second surface of the at least one of the plurality of multi-element bars via a protection sheet, the second surface being opposite a third surface corresponding to the first surface of the at least one of the plurality of multi-element bars.

12. A method according to claim 11, wherein the protection sheet includes a polyethylene terephthalete sheet, a surface of which is to be in contact with the pressure member is coated with a silicone resin.

13. A method for producing a semiconductor element comprising the steps of:

forming a plurality of grooves on a first surface of a semiconductor multi-layer structure along a first direction;

forming a plurality of multi-element bars by cleaving the semiconductor multi-layer structure along a second direction;

placing at least one of the plurality of multi-element bars on a support stage that includes a rigid material; and cleaving the at least one of the plurality of multi-element bars along the plurality of grooves by moving a pressure member in a longitudinal direction of the at least one of the plurality of multi-element bars while a constant load is applied by the pressure member to a second surface of the at least one of the plurality of multi-element bars, the second surface being opposite a third surface corresponding to the first surface of the at least one of the plurality of multi-element bars.

14. A method according to claim 13, wherein the rigid material includes a least one of a quartz, a glass, a metal, a stone, and a rigid plastic.

15. A method for producing a semiconductor element comprising the steps of:

forming a plurality of grooves on a first surface of a semiconductor multi-layer structure along a first direction;

forming a plurality of multi-element bars by cleaving the semiconductor multi-layer structure along a second direction;

placing at least one of the plurality of multi-element bars on a support stage; and cleaving the at least one of the plurality of multi-element bars along the plurality of grooves by moving a pressure member in a longitudinal direction of the at least one of the plurality of multi-element bars at a speed of about 10 mm/sec or more and about 100 mm/sec or less while a constant load is applied by the pressure member to a second surface of the at least one of the plurality of multi-element bars, the second surface being opposite a third surface corresponding to the first surface of the at least one of the plurality of multi-element bars.

16. A method for producing a semiconductor element comprising the steps of:

forming a plurality of grooves on a first surface of a semiconductor multi-layer structure along a first direction;

forming a plurality of multi-element bars by cleaving the semiconductor multi-layer structure along a second direction;

placing at least one of the plurality of multi-element bars on a support stage; and cleaving the at least one of the plurality of multi-element bars along the plurality of grooves by moving a pressure member in a longitudinal direction of the at least one of the plurality of multi-element bars while a constant load of about 5 N or more and about 20 N or less per multi-element bar is applied by the pressure member to a second surface of the at least one of the plurality of multi-element bars, the second surface being opposite a third surface corresponding to the first surface of the at least one of the plurality of multi-element bars.

17. A cleavage apparatus for producing a semiconductor element using at least one multi-element bar, a plurality of grooves being provided in a predetermined direction on a first surface of the at least one multi-element bar, the apparatus comprising:

a support stage for the at least one multi-element bar being provided; and a pressure member for applying a constant load to a second surface of the at least one multi-element bar, the second surface being opposite the first surface of the at least one multi-element bar, while the pressure member is moved in a longitudinal direction of the at least one multi-element bar at a speed of about 10 mm/sec or more and about 100 mm/sec or less.

18. A cleavage apparatus for producing a semiconductor element using at least one multi-element bar, a plurality of grooves being provided in a predetermined direction on a first surface of the at least one multi-element bar, the apparatus comprising:

a support stage for the at least one multi-element bar being provided; and a pressure member for applying a constant load of about 5 N or more and about 20 N or less per multi-element bar to a second surface of the at least one multi-element bar, the second surface being opposite the first surface of the at least one multi-element bar, while the pressure member is moved in a longitudinal direction of the at least one multi-element bar.

19. A cleavage apparatus for producing a semiconductor element using at least one multi-element bar, a plurality of grooves being provided in a predetermined direction on a first surface of the at least one multi-element bar, the apparatus comprising:

a support stage for the at least one multi-element bar being provided; and a pressure member that does not rotate on the at least one multi-element bar for applying a constant load to a second surface of the at least one multi-element bar, the second surface being opposite the first surface of the at least one multi-element bar, while the pressure member is moved in a longitudinal direction of the at least one multi-element bar.

20. A cleavage apparatus for producing a semiconductor element using at least one multi-element bar, a plurality of grooves being provided in a predetermined direction on a first surface of the at least one multi-element bar, the apparatus comprising:

a support stage for the at least one multi-element bar being provided; and a pressure member held by a spring for applying a constant load to a second surface of the at least one multi-element bar by the spring, the second surface being opposite the first surface of the at least one multi-element bar, while the pressure member is moved in a longitudinal direction of the at least one multi-element bar.

* * * * *